United States Patent [19]
Gulczynski

[11] Patent Number: 4,763,080
[45] Date of Patent: Aug. 9, 1988

[54] SWITCHING POWER AMPLIFIER

[76] Inventor: Zdzislaw Gulczynski, P.O. Box 441, Winchester, Mass. 01890

[21] Appl. No.: 53,634

[22] Filed: May 26, 1987

[51] Int. Cl.$^4$ .............................................. H23F 3/38
[52] U.S. Cl. ................................................... 330/10
[58] Field of Search ..................... 330/10, 207 A, 251; 363/89

[56] References Cited
U.S. PATENT DOCUMENTS
4,571,551  2/1986  Trager ................................. 330/10

Primary Examiner—James B. Mullins

[57] ABSTRACT

The invention generally relates to a switching power amplifier, particularly for high power, highly efficient audio amplification. The power amplifier operates at a high switching frequency and includes a generator. The generator is coupled to receive the line voltage for converting it into a high frequency generator signal and includes at least one capacitor for storing a DC voltage. A bidirectional switch is coupled in series with the output of the generator for selectively applying the generator signal to the load via a low-pass filter, for providing a correction of the output signal of the amplifier. The shape, magnitude and frequency of the generator signal are not essential. The switch is the only power component which must be responsive to the input and output signals of the amplifier, and the generator signal. Generally, it can be switched at any time as to allow the correction. The low-pass filter having an inductive input is employed. However, the switch is protected against voltage surges as an excessive voltage thereacross is transformed, rectified and applied to the capacitor of the generator.

11 Claims, 2 Drawing Sheets

SWITCHING POWER AMPLIFIER

CROSS REFERENCE TO RELATED APPLICATIONS

This application is related to the application entitled "Switching Circuits Performing Thyristor And Triac Functions", Ser. No. 53,635 filed on even date herewith, the content of which is hereby incorporated by reference herein, and is also related to two applications each entitled "Switching Power Supply" Ser. Nos. 936,293 and 35,479 filed on 12/2/86 and 4/7/87 respectively. All inventions are by the same inventor.

BACKGROUND OF THE INVENTION

The invention generally relates to a switching power amplifier, particularly for high power, highly efficient audio amplification. The power amplifier operates at a high switching frequency and comprises a generator means which includes power supply with a line isolation.

Power amplifiers are devices designed to amplify an input signal and provide an undistorted high power output signal which is independent of supply voltages, load fluctuations over frequency, operating temperature, etc. Specifically, switching power amplifiers provide significantly higher efficiency by employing high speed switches.

The disadvantages of conventional switching power amplifiers are many. The audio signal is usually converted into a specific pulse width modulated (PWM) signal which is a combination of analog and digital signals. The pulse width can have any value within a switching period and is influenced by all kinds of errors. Each of the complementary output transistors must switch at least once within the high frequency period. A poor tracking of the transistor switching times results in asymmetric errors in pulse width. Power supply ripples and pulse amplitude errors depend on output power which increases distortion level, particularly near crossover point. Pulses are lost near extremes of modulation. A dead time of the transistors is inevitable in order to prevent overlapping of the conduction phases thereof due to drive asymmetry, poor transistor recovery characteristics or inadequate deadband of a control circuitry.

Furthermore, the output filter in resonant configuration is designed for one specific frequency. Its performance is poor due to design concepts, such as the PWM, rather than practical limits of the components. A very high switching frequency is necessary, mostly tens of times higher than a maximum frequency of the amplified signal. This results in a further reduced efficiency and a relatively high distortion level due to the limited switching performance of the power switches. Another unsolved problem is a desirable load having a relatively stable impedance over frequency. The equivalent switching frequency of the individual transistors is actually significantly higher as the switching times thereof are a fraction of the switching period. A switching power supply is common. This further increases the complexity and in most cases generates a huge amount of EMI/RFI, especially into the line. Numerous interference suppressors and protection circuits are inevitable.

In conclusion, except for a small size of a common switching power amplifier there is no reason for a user to give preference to it over a conventional analog power amplifier.

SUMMARY OF THE INVENTION

Accordingly, the present invention is intended to provide a switching power amplifier having a very low number of components, short response time, very high reliability and efficiency.

A switching power amplifier according to the present invention includes a generator means for providing a generator signal and including at least one capacitor for storing a DC supply voltage of the generator means, a low-pass filter having a substantially inductive input and including a first inductor, for providing the output signal, a switch means responsive to the input, generator and output signals for selectively applying the generator signal to the low-pass filter input for providing corrections of the output signal of the switching power amplifier, at least one second inductor magnetically coupled to the first inductor, and rectifier means coupled for rectifying voltages appearing across the second inductor for providing charging current to the capacitor of the generator means.

In another embodiment switching power amplifier includes a generator means for providing a generator signal and including at least one capacitor for storing a DC supply voltage of the generator means, a low-pass filter having a substantially inductive input, for providing the output signal, a switch means responsive to the input, generator and output signals for selectively applying the generator signal to the low-pass filter input for providing corrections of the output signal of the switching power amplifier, a transformer having a primary winding coupled to the low-pass filter input, and at least one secondary winding, and rectifier means coupled for rectifying voltages appearing across the secondary winding of the transformer for providing charging current to the capacitor of the generator means.

The present embodiments are thus operable with a single bidirectional switch responsive to the input, generator and output signals which is coupled between the output of the generator means and a low-pass filter having an inductive input. However, the switch is protected against an excessive voltage thereacross. The energy loss is minimal.

BRIEF DESCRIPTION OF THE DRAWINGS

The present invention will become more clear in conjunction with the accompanying figures of which.

DETAILED DESCRIPTION OF THE INVENTION

Generally, the switching power amplifier according to the present invention consists of a generator means, a switch means, a low-pass filter, a transformer and rectifier means. The generator means is coupled to receive the line voltage for converting it into a high frequency output signal, called generator signal. Naturally, the generator means comprises at least one capacitor for storing a DC supply voltage so that it can constantly deliver an energy to the output independently of the level of the AC line voltage. The generator means also preferably includes a transformer for providing a line isolation. For simplicity, the transformer can be coupled directly to the output of the generator means.

The switch means includes a bidirectional switch which is coupled in series with the output of the generator means for selectively applying the generator signal to the load via the low-pass filter, for providing a correction of the output signal of the amplifier. It shall be pointed out that the switch is the only power component which must be responsive to the input and output signals of the amplifier, and the generator signal. Generally, it can be switched at any time as to allow the correction.

Figure 1:
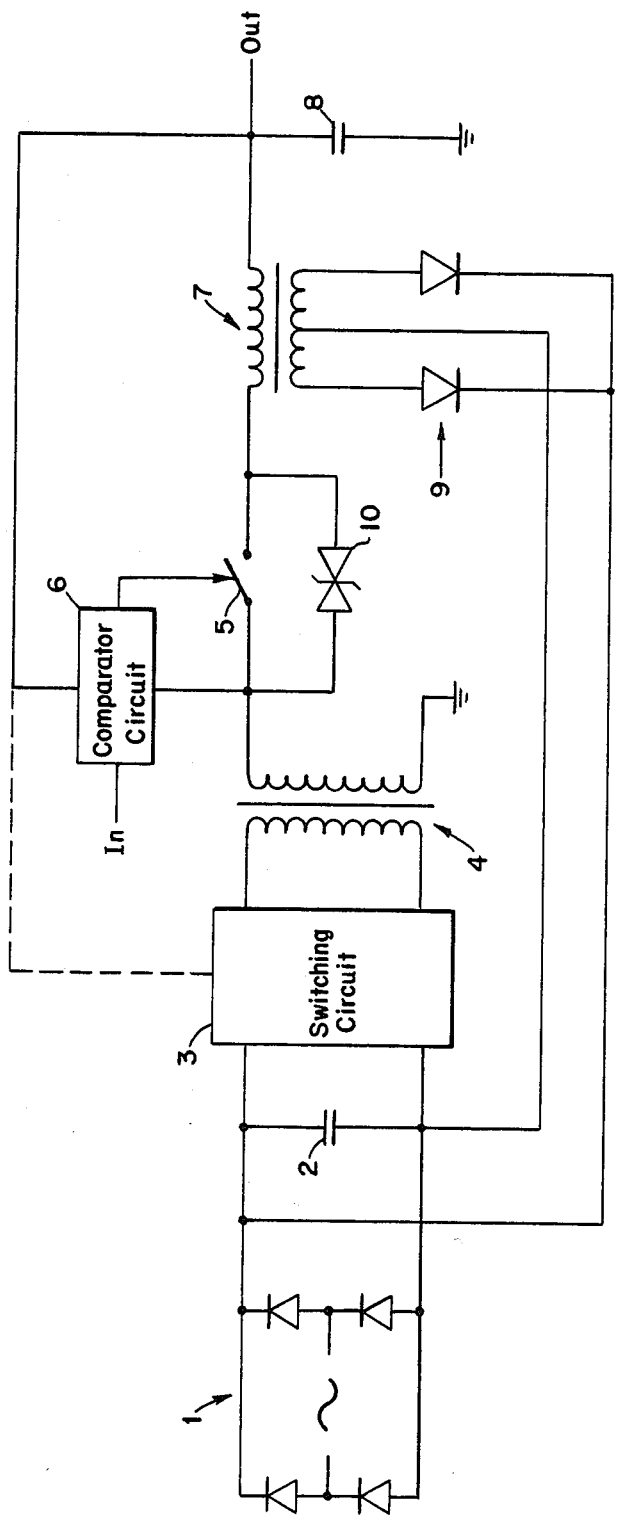
FIG. 1 is a first embodiment of the amplifier.

The switching power amplifier in FIG. 1 comprises the generator means including the diode bridge 1, capacitor 2, switching circuit 3 and transformer 4. The line voltage is applied to the common diode bridge 1 which charges the capacitor 2 to the peak voltage of the line. This voltage is received by the switching circuit 3 and converted into a high frequency output signal which is further transformed in the transformer 4 and appears at the secondary winding thereof as the generator voltage.

Conventional switching power supplies can be used as the generator means, e.g. a push-pull or resonant converter. They also commonly employ a rectifier network, an input capacitor, a switching circuit and an output transformer, such as respectively 1, 2, 3 and 4 of FIG. 1. A switching power supply described in the patent application entitled "Switching power supply" having Ser. No. 035,479 and filed on 4/7/87 by the same inventor, is recommended for a significantly higher performance. The disclosure of this application is hereby incorporated by reference herein.

The amplitude of the generator voltage must be higher than the desired output voltage of the power amplifier, i.e. it can be changed with the varying momentary value of the desired output voltage by adequately operating the switches of the switching circuit 3. Moreover, the shape of the generator voltage does not matter. For instance, this can be basically square, triangular or sine wave. Similarly, the frequency of the voltage can vary in a wide range, however it must be at least two times higher than the maximum amplified, e.g. audio frequency.

The switch means consists of the comparator circuit 6 controlling the switch 5. The switch 5 is coupled in series with the output of the generator means and is closed when the magnitude and polarity of the generator voltage allows a correction of the output voltage on the load. Thus, the generator signal is selectively applied to the load. For that purpose the comparator circuit 6 comparing these two voltages and the actual input signal of the amplifier is employed, wherein the direction of the generator means output current allowing the correction is determined. This technique has been described in the patent application entitled "Switching power supply" having Ser. No. 035,479 and filed on 4/7/87 by the same inventor.

The high frequency generator signal must be applied to a filter having low-pass properties. An LC network is necessary for minimizing a power dissipation. The low-pass filter is coupled prior to the load, e.g. a loudspeaker, and has the purpose of smoothing out the generator signal. The filter can be even more accurately described as a time constant network as the result is a corrective noise signal superimposed onto the output signal of the power amplifier.

A simplest example of the low-pass filter is an inductor coupled between the switch 5 and the amplifier output, and a capacitor coupled between the output and ground, i.e. parallel to the load. Respectively, FIG. 1 shows the transformer 7 having a primary winding as the basic inductor of the filter, and the capacitor 8. Generally, the low-pass filter has a substantially inductive input. This simply means that the switching of the switch 5, especially at a high current, is liable to generate a troublesome voltage transient at the input of the filter due to an inductive portion thereof.

The generator signal is applied to the low-pass filter by closing the switch 5. However, while the switch is opened a high uncontrollable voltage appears thereacross. In order to reduce this effect to a very short period of time, i.e. a spike, the transformer 7 rather than a single inductor is used. The voltage appearing across the primary winding of the transformer 7 is limited. The voltage appearing across the secondary winding thereof is rectified by one of the diodes 9 and applied to the capacitor 2, thus limited by a voltage thereacross. The transient voltage spike still appearing across the switch 5 due to a leakage inductance of the transformer 7, limited recovery characteristics of the diodes 9, etc., is eliminated by the bidirectional transient voltage suppressor 10 coupled in parallel with the switch 5.

The turns ratio between the primary to secondary windings of the transformer 7 is chosen in such a manner that no charging of the capacitor 2 via the diodes 9 takes place whenever the switch 5 is closed, i.e. the charging current to the capacitor 2 is disabled. Thus, the energy is transformed only under the voltage surge condition across the switch 5. With the switch 5 open, the energy is still delivered to the load and also to the capacitor 2 which is an input source. The turns ratio accuracy is not critical. The charging of the capacitor 2 with the switch closed would however reduce the performance of the amplifier, e.g. due to higher currents of the switch 5.

A high frequency switching may occur, e.g. when the input signal is equal zero. This however can be easily eliminated, e.g. by an adequately triggering a monoflop to determine a minimum pulse length of the switch. The switch can also remain open for a long time, such as in case of a low frequency, small output signal or a capacitive load. Another example is a short circuit determined by an appropriate circuit sensing the output current of the amplifier or the load impedance, wherein the operation of the generator means can remain unaffected.

As mentioned, amplitude of the generator voltage can be changed with the varying momentary value of the amplifier output voltage. Also switching frequency can be changed to increase the efficiency. Therefore, the feedback from the amplifier output to the switching circuit 3 is used, wherein the feedback means can include an isolation amplifier. It shall be pointed out that an approximate value of the output voltage provided by the feedback is sufficient for determining the operating conditions of the generator means. The feedback can also provide an information about the output current of the amplifier for determining short circuit condition, character of the load, etc.

Figure 2:
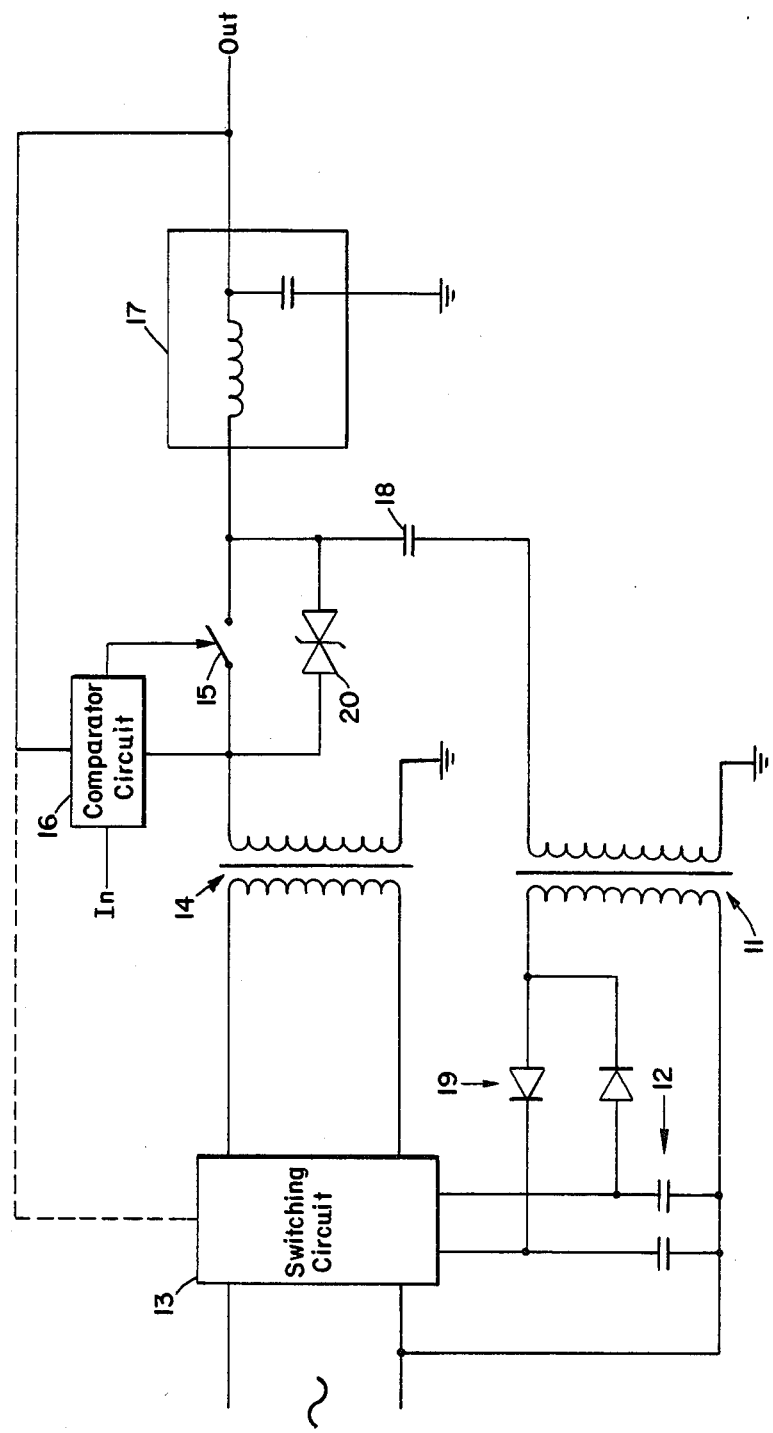
FIG. 2 is the preferred embodiment.

FIG. 2 is the preferred embodiment of the amplifier. The generator means comprises the capacitor pair 12, switching circuit 13 and transformer 14. The line voltage is directly applied to the switching circuit 13. The capacitors 12 are coupled to store DC voltages of opposite polarities. A high frequency signal provided by the switching circuit 13 is further transformed in the transformer 14 and appears at the secondary winding thereof as the generator signal. A switching power supply which can be employed as the generator means is described in the patent application entitled "Switching power supply" having Ser. No. 936,293 and filed on 12/2/86 by the same inventor. The disclosure of this application is hereby incorporated by reference herein.

The switch 15 is coupled in series with the output of the generator means and is closed when the magnitude and polarity of the generator voltage allows a correction of the output voltage on the load, similarly to the switch 5 in FIG. 1. The switch 15 is controlled by the comparator circuit 16, such as 6 in FIG. 1. The low-pass filter 17 is coupled between the switch 15 and the output of the amplifier. A simple example of the filter 17 is shown as an inductor and capacitor coupled in series, similarly to primary winding of the transformer 7 and capacitor 8 in FIG. 1.

The primary winding of the transformer 11 is coupled parallel to the input of the low-pass filter 17. The voltage appearing thereacross is transformed and rectified by one of the diodes 19. This voltage is applied to a respective capacitor 12, thus limited by a voltage thereof. A voltage surge appearing across the switch 15 while the switch is opened, due to the inductive input of the low-pass filter 17, is thus reduced to a voltage spike. This spike can be easily eliminated by a bidirectional transient voltage suppressor 20 coupled in parallel with the switch 15, similarly to 10 in FIG. 1. The optional capacitor 18 is coupled in series with the primary winding of the transformer 11 and corrects any flux symmetry problems thereof and prevents a DC current flow therethrough.

For a higher amplifier efficiency the turns ratio between the primary to secondary windings of the transformer 11 should be chosen in such a manner that no charging of the capacitors 12 via the diodes 19 takes place whenever the switch 15 is closed. Thus, the energy is transformed only under the voltage surge condition across the switch 15. However, the turns ratio accuracy is not critical.

The transformer 11 has a simple secondary winding for charging one of the capacitors 12 via the respective one of the diodes 19. Any other configuration can be used, e.g. a winding with a center-tap and a full-wave diode bridge for charging both capacitors 12 when the absolute values of voltages thereacross are approximately equal. Moreover, multiple secondary windings each having a rectifier means providing rectified signals to a least one capacitor of the generator means can be employed.

The output voltage amplitude and the switching frequency of the generator means can be changed with the varying momentary value of the desired amplifier output signal. For that purpose a feedback providing an approximate value of this signal, i.e. voltage and/or current, to the switching circuit 13 can be used.

The embodiments of the present invention described herein are intended to be taken in an illustrative and not a limiting sense. Various modifications and changes may be made to these embodiments by persons skilled in the art without departing from the scope of the present invention as defined in the appended claims.

What I claim is:

1. Switching power amplifier for amplifying an input signal to provide an output signal, comprising:
    a generator means for providing a generator signal and including at least one capacitor for storing a DC supply voltage of the generator means;
    a low-pass filter having a substantially inductive input and including a first inductor, for providing the output signal;
    a switch means responsive to the input, generator and output signals for selectively applying the generator signal to the low-pass filter input for providing corrections of the output signal of the switching power amplifier;
    at least one second inductor magnetically coupled to the first inductor; and
    rectifier means coupled for rectifying voltages appearing across the second inductor for providing charging current to the capacitor of the generator means.

2. Switching power amplifier of claim 1, wherein the first and second inductors have a turns ratio which disables charging current to the capacitor when the generator signal is applied to the low-pass filter input.

3. Switching power amplifier of claim 1, wherein the generator means further includes an output transformer coupled to provide the generator signal.

4. Switching power amplifier of claim 1, further comprising feedback means providing the output signal to the generator means.

5. Switching power amplifier of claim 1, wherein the switch means includes a switch and a transient voltage suppressor bridging the switch to limit an excessive voltage appearing thereacross.

6. Switching power amplifier for amplifying an input signal to provide an output signal, comprising:
    a generator means for providing a generator signal and including at least one capacitor for storing a DC supply voltage of the generator means;
    a low-pass filter having a substantially inductive input, for providing the output signal;
    a switch means responsive to the input, generator and output signals for selectively applying the generator signal to the low-pass filter input for providing corrections of the output signal of the switching power amplifier;
    a transformer having a primary winding coupled to the low-pass filter input, and at least one secondary winding; and
    rectifier means coupled for rectifying voltages appearing across the secondary winding of the transformer for providing charging current to the capacitor of the generator means.

7. Switching power amplifier of claim 6, wherein the transformer has a turns ratio which disables charging current to the capacitor when the generator signal is applied to the low-pass filter input.

8. Switching power amplifier of claim 6, wherein the generator means further includes an output transformer coupled to provide the generator signal.

9. Switching power amplifier of claim 6, further comprising feedback means providing the output signal to the generator means.

10. Switching power amplifier of claim 6, wherein the switch means includes a switch and a transient voltage suppressor bridging the switch to limit an excessive voltage appearing thereacross.

11. Switching power amplifier of claim 6, further including a second capacitor coupled in series with the primary winding of the transformer.

* * * * *